United States Patent
Kawano

(10) Patent No.: US 10,020,241 B2
(45) Date of Patent: Jul. 10, 2018

(54) HEAT-DISSIPATING STRUCTURE AND METHOD FOR MANUFACTURING SAME

(71) Applicant: Contec Co., Ltd., Nishiyodogawa-ku, Osaka-shi, Osaka (JP)

(72) Inventor: Tadashi Kawano, Osaka (JP)

(73) Assignee: Contec Co., Ltd., Nishiyodogawa-ku (JP)

( * ) Notice: Subject to any disclaimer, the term of this patent is extended or adjusted under 35 U.S.C. 154(b) by 0 days.

(21) Appl. No.: 15/526,099

(22) PCT Filed: Nov. 20, 2015

(86) PCT No.: PCT/JP2015/082769
§ 371 (c)(1),
(2) Date: May 11, 2017

(87) PCT Pub. No.: WO2016/084751
PCT Pub. Date: Jun. 2, 2016

(65) Prior Publication Data
US 2017/0330817 A1    Nov. 16, 2017

(30) Foreign Application Priority Data
Nov. 28, 2014 (JP) .................. 2014-240675

(51) Int. Cl.
*H01L 23/40* (2006.01)
*H01L 23/427* (2006.01)

(52) U.S. Cl.
CPC .......... *H01L 23/40* (2013.01); *H01L 23/427* (2013.01); *H01L 2924/0002* (2013.01); *H01L 2924/14* (2013.01)

(58) Field of Classification Search
CPC ....... H01L 23/4006; H01L 2924/00012; H01L 2023/405; H01L 2023/4087;
(Continued)

(56) References Cited

U.S. PATENT DOCUMENTS 3,766,977 A * 10/1973 Pravda ................ H01L 23/4006
                                                                    165/185
4,012,770 A *  3/1977 Pravda .................. H01L 23/367
                                                                    165/104.26
(Continued)

FOREIGN PATENT DOCUMENTS

JP       08-236664 A   9/1996   ............. H01L 23/34
JP       10-242671 A   9/1998   ............... H05K 7/20
(Continued)

OTHER PUBLICATIONS

Extended European Search Report issued in corresponding European Patent Application No. 15863346.1, dated Dec. 1, 2017.
(Continued)

*Primary Examiner* — Adam B Dravininkas
(74) *Attorney, Agent, or Firm* — Kusner & Jaffe

(57) ABSTRACT

A heat-dissipating structure including a heat sink having a recessed portion on a first surface facing a heat generator, the recessed portion having a side surface; a heat block fit into the recessed portion, the heat block having a bottom surface and a side surface; and thermally conductive grease in contact with both of the side surface of the recessed portion and the side surface of the heat block, wherein the bottom surface of the heat block is in contact with the heat generator.

4 Claims, 5 Drawing Sheets

(58) Field of Classification Search
CPC ..... H01L 2023/4031; H01L 2023/4056; H01L 23/40; H01L 23/427; H01L 2924/0002; H01L 2924/14; H05K 1/0306; H05K 7/20854; H05K 3/0061

See application file for complete search history.

(56) References Cited

U.S. PATENT DOCUMENTS

| | | | |
|---|---|---|---|
| 5,814,536 A * | 9/1998 | Rostoker | H01L 21/4878 257/E23.102 |
| 5,828,564 A | 10/1998 | Mori et al. | 363/141 |
| 5,969,949 A | 10/1999 | Kim et al. | |
| 6,251,709 B1 * | 6/2001 | Yoshikawa | H01L 23/4338 257/E23.094 |
| 2005/0088092 A1 * | 4/2005 | Kim | H05K 7/20963 313/582 |
| 2010/0008045 A1 * | 1/2010 | Xu | H01L 23/367 361/709 |

FOREIGN PATENT DOCUMENTS

| | | | | |
|---|---|---|---|---|
| JP | 2005-026248 A | 1/2005 | ............ | H01L 23/36 |
| JP | 2005-327940 A | 11/2005 | ............... | H05K 7/20 |
| JP | 2007243051 A | 9/2007 | | |
| JP | 2010-267663 A | 11/2010 | ............ | H01L 23/36 |
| JP | 2012248700 A | 12/2012 | | |
| JP | 2014-135418 A | 7/2014 | ............... | H05K 7/20 |

OTHER PUBLICATIONS

International Search Report from corresponding International Patent Application No. PCT/JP2015/082769, dated Feb. 2, 2016.

* cited by examiner

HEAT-DISSIPATING STRUCTURE AND METHOD FOR MANUFACTURING SAME

FIELD OF THE INVENTION

The present invention relates to a heat-dissipating structure that dissipates heat from a heat generator to the outside.

BACKGROUND OF THE INVENTION

As a configuration example of a known heat-dissipating structure of the related art, FIG. 9 shows a heat-dissipating structure 3 including a heat sink 70, a heat block 20, and a thermally conductive sheet 60 interposed between the heat sink 70 and the heat block 20. The heat block 20 of the heat-dissipating structure 3 is in contact with a heat generator 50 provided on, for example, a printed circuit board 40. Thus, heat generated by the heat generator 50 is dissipated to the outside along a heat dissipation route HR2 where the heat from the heat generator 50 sequentially passes through the heat block 20, the thermally conductive sheet 60, and the heat sink 70.

In this configuration, the thermally conductive sheet 60 accommodates dimensional tolerances in the thickness direction of the components and erection tolerances between the components. In this case, the tolerances mean variations caused by small undulations or slopes on the surfaces of the components and machining/assembly. The accommodation of these tolerances secures adhesion between the heat sink 70 and the heat block 20.

As shown in FIG. 10, Japanese Patent Laid-Open No. 2005-327940 (Patent Literature 1) discloses a heat-dissipating structure 4 including a heat sink 80 having a projecting portion and a thermally conductive sheet 60 in contact with the projecting portion of the heat sink 10. In this configuration, a through hole is formed on a printed circuit board 40 and the projecting portion of the heat sink 80 is fit into the through hole of the printed circuit board 40, locating the thermally conductive sheet 60 between the heat generator 50 and the projecting portion of the heat sink 80. Thus, heat generated by the heat generator 50 is dissipated to the outside along a heat dissipation route HR3 where the heat from the heat generator 50 sequentially passes through the thermally conductive sheet 60 and the heat sink 80.

SUMMARY OF INVENTION

Technical Problem

In such a configuration, the thermal conductivity of a thermally conductive sheet is typically lower than those of a heat sink and a heat block. Moreover, as described above, the thermally conductive sheet accommodates dimensional tolerances in the thickness direction of the components and erection tolerances between the components, requiring at least a certain thickness. In the configuration of the heat-dissipating structure of the related art, heat from the heat generator is always dissipated to the outside through the thermally conductive sheet. This disadvantageously reduces the heat dissipation efficiency of the heat-dissipating structure.

On the other hand, if the thermally conductive sheet is not used, the tolerances cannot be accommodated and thus adhesion decreases between the heat sink and the heat block, thereby reducing the heat dissipation efficiency of the heat-dissipating structure. Moreover, the thermally conductive sheet may be replaced with thermally conductive grease having a larger thermal conductivity than the thermally conductive sheet. However, the thermally conductive grease cannot sufficiently secure adhesion between the heat sink and the heat block because of large dimensional tolerances in the thickness direction.

Also in the configuration of the heat-dissipating structure described in Patent Literature 1, the thermally conductive sheet is used and heat generated from the heat generator is dissipated to the outside through the thermally conductive sheet, resulting in the same problem.

An object of the present invention is to improve heat dissipation efficiency as compared with a heat-dissipating structure of the related art.

Solution to Problem

A heat-dissipating structure of the present invention includes a heat sink having a recessed portion on a first surface facing a heat generator, the recessed portion having a side surface; a heat block fit into the recessed portion, the heat block having a bottom surface and a side surface; and thermally conductive grease in contact with both of the side surface of the recessed portion and the side surface of the heat block, wherein the bottom surface of the heat block is in contact with the heat generator.

Advantageous Effect of Invention

The heat-dissipating structure of the present invention can improve heat dissipation efficiency as compared with the heat-dissipating structure of the related art.

Figure 1:
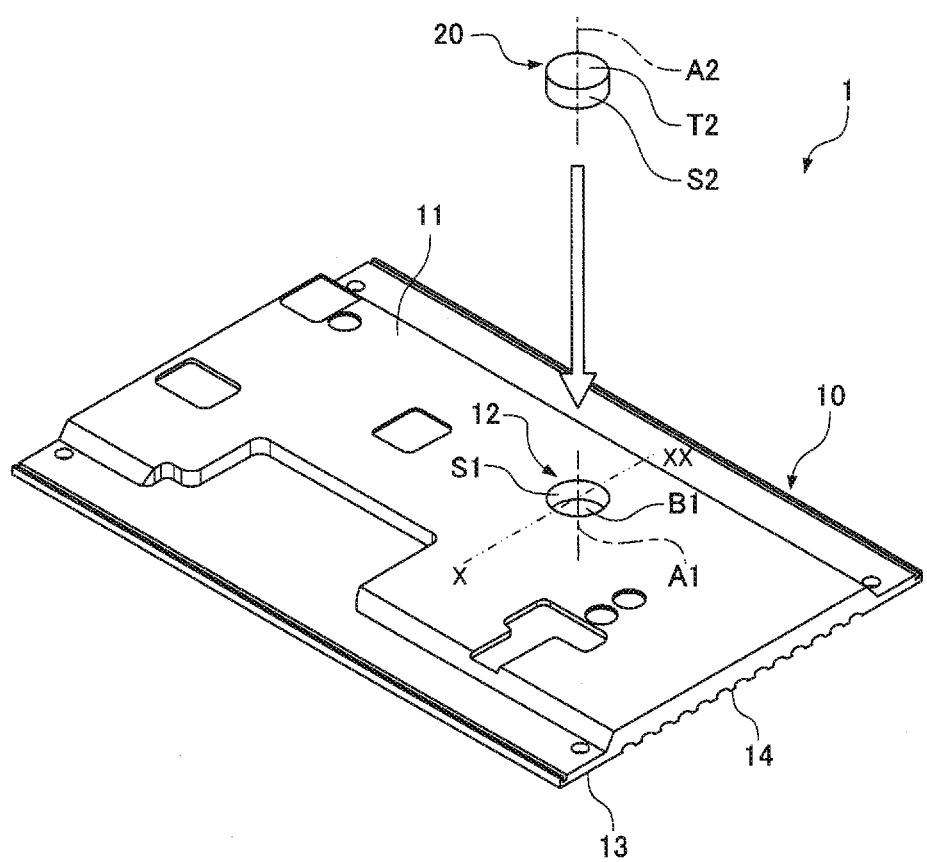
FIG. 1 is a perspective view showing a heat-dissipating structure according to a first embodiment of the present invention.
Figure 2:
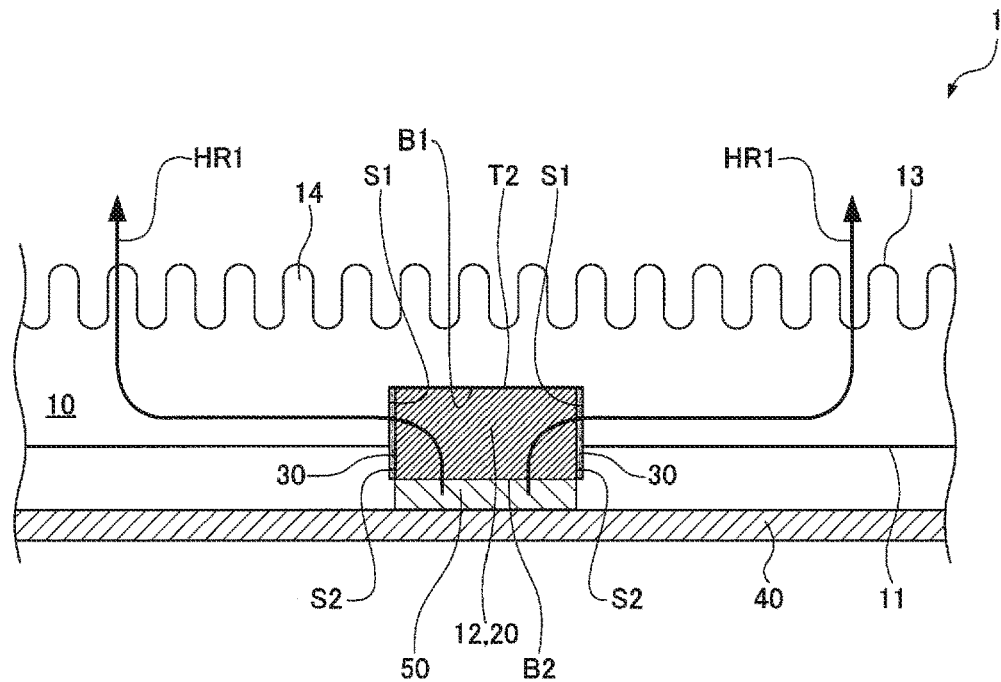
FIG. 2 is a cross-sectional view taken along line X-XX of the heat-dissipating structure.

DETAILED DESCRIPTION OF THE INVENTION (First Embodiment)
Referring to FIGS. 1 and 2, a heat-dissipating structure according to a first embodiment of the present invention will be described below. As shown in FIGS. 1 and 2, a heat-dissipating structure 1 according to the first embodiment of the present invention includes a heat sink 10, a heat block 20, and thermally conductive grease 30. A heat generator 50 provided on, for example, a printed circuit board 40 is in contact with the heat block 20 and thus heat generated by the heat generator 50 can be dissipated from the heat sink 10. The constituent elements of the heat-dissipating structure 1 will be specifically described below.

The heat sink 10 has a first surface 11 facing the heat generator 50. The first surface 11 has a recessed portion 12. The recessed portion 12 has a side surface 51 and a bottom surface B1. Specifically, the recessed portion 12 has a cylindrical shape with a central axis A1 perpendicular to the first surface 11 of the heat sink 10. Moreover, a fin 14 is provided on a second surface 13 opposite to the first surface 11 of the heat sink 10. The fin 14 provided on the second surface 13 of the heat sink 10 increases the surface area of the heat sink 10, thereby improving the heat dissipation efficiency of the heat-dissipating structure 1. However, the present invention is not limited to the configuration including the fin on the second surface 13 of the heat sink 10.

The heat block 20 has a top surface T2, a side surface S2, and a bottom surface B2. Specifically, the heat block 20 has a cylindrical shape with a central axis A2 perpendicular to the first surface 11 of the heat sink 10. The heat block 20 is fit into the recessed portion 12 of the heat sink 10. The bottom surface B2 of the heat block 20 is in contact with the heat generator 50. The heat block 20 in contact with the heat generator 50 can temporarily dissipate heat from the heat generator 50 to the heat block 20, thereby preventing heat emitted from the heat generator 50 itself from persisting so as to damage the heat generator 50.

The thermally conductive grease 30 is interposed between the side surface S1 of the recessed portion 12 and the side surface S2 of the heat block 20. In other words, the thermally conductive grease 30 is in contact with both of the side surfaces S1 and S2. This configuration can improve adhesion between the side surface S1 of the recessed portion 12 and the side surface S2 of the heat block 20. The thermally conductive grease 30 is paste that can be easily deformed. For example, the thickness of the thermally conductive grease 30 can be larger than 0 [mm] and smaller than or equal to 0.3 [mm]. In order to improve adhesion between the heat generator 50 and the bottom surface B2 of the heat block 20, thermally conductive grease is preferably provided also between the heat generator 50 and the heat block 20. The thermally conductive grease 30 is made of, for example, silicon and has a thermal conductivity of 3.0 [W/(m·K)]. Metallic particles of silver or the like may be mixed with the thermally conductive grease 30 to improve the thermal conductivity.

With this configuration, heat generated by the heat generator 50 is dissipated to the outside along a heat dissipation route HR1 where the heat from the heat generator 50 sequentially passes through the heat block 20, the thermally conductive grease 30, and the heat sink 10. This can improve heat dissipation efficiency as compared with the heat-dissipating structure of the related art, which will be specifically discussed below.

Figure 9:
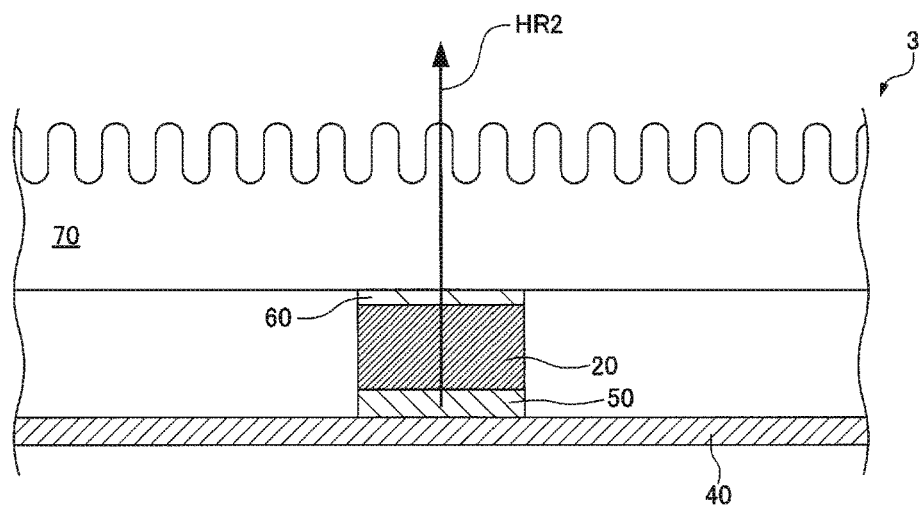
FIG. 9 is a cross-sectional view showing a heat-dissipating structure of the related art.
Figure 10:
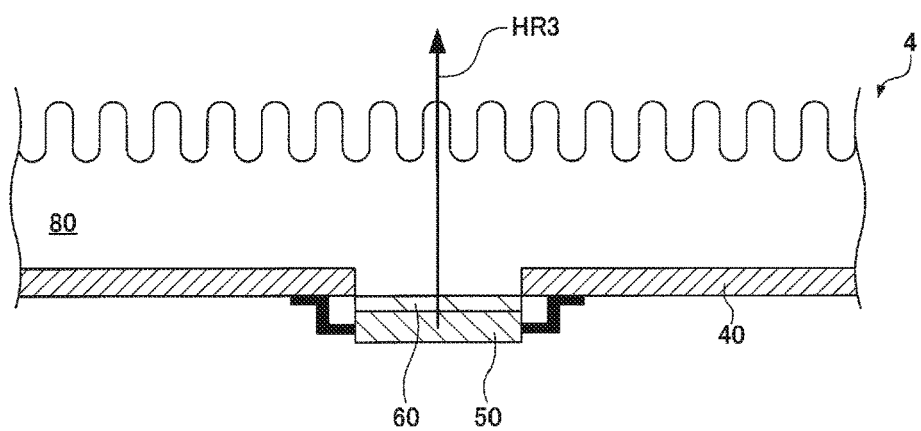
FIG. 10 is a cross-sectional view showing a heat-dissipating structure of the related art.

In the configurations of the heat-dissipating structure of the related art, as shown in FIG. 9, the heat sink 10 does not have a recessed portion while the heat sink 70 is in contact with the heat block 20 with a thermally conductive sheet 60 interposed between the heat sink 70 and the heat block 20. Thus, heat generated from the heat generator 50 is always dissipated to the outside through the thermally conductive sheet 60.

The thermal conductivity of the thermally conductive sheet 60 is typically lower than that of the heat sink 10 and the heat block 20. For example, the heat sink 10 and the heat block 20 are made of materials such as copper and aluminum. The thermal conductivity of copper is 398 [W/(m·K)] while the thermal conductivity of aluminum is 236 [W/(m·K)]. The thermally conductive sheet 60 made of materials such as silicon having a thermal conductivity of 2.3 [W/(m·K)].

Further, the thermally conductive sheet 60 accommodates dimensional tolerances in the thickness direction of the components, specifically, the dimensional tolerance of the thickness of the heat sink 10, the dimensional tolerance of the thickness of the heat block 20, the dimensional tolerance of the thickness of the heat generator 50, and the dimensional tolerance of the thickness of the printed circuit board 40. The thermally conductive sheet 60 also accommodates erection tolerances between the components, specifically, an erection tolerance between the printed circuit board 40 and the heat generator 50 and an erection tolerance between the heat generator 50 and the heat block 20. This can secure adhesion between the heat sink 10 and the heat block 20. In order to accommodate these tolerances, the thermally conductive sheet 60 needs to have at least a certain thickness and a certain degree of elasticity.

For example, the thickness of the heat sink 70 has a dimensional tolerance of 0.05 [mm], the thickness of the heat block 20 has a dimensional tolerance of 0.05 [mm], the thickness of the heat generator 50 has a dimensional tolerance of 0.1 [mm], the thickness of the printed circuit board 40 has a dimensional tolerance of 0.05 [mm], an erection tolerance between the printed circuit board 40 and the heat generator 50 is 0.05 [mm], and an erection tolerance between the heat generator 50 and the heat block 20 is 0.1 [mm]. The sum of the tolerances is 0.4 [mm]. For example, thermally conductive grease that is larger than 0 [mm] and smaller than or equal to 0.3 [mm] in thickness cannot sufficiently accommodate such large tolerances and thus the thermally conductive sheet 60 having a thickness of, for example, 2.0 [mm] is used instead. The thermally conductive sheet 60 is compressed into a thickness of, for example, 1.6 [mm] between the heat sink 70 and the heat block 20.

In this case, a heat transfer amount is used as an index indicating the heat dissipation efficiency of the heat-dissipating structure. A heat transfer amount is a heat amount that moves from one surface to the other surface of an object. As indicated by expression 1 below, a heat transfer amount is proportionate to an object area. A, a thermal conductivity C of the object, and a temperature difference D between both surfaces of the object, and is inversely proportionate to an object thickness B.

$$E = A/B \times C \times D \quad \text{expression 1}$$

where A is an area [m²], B is a thickness [m], C is a thermal conductivity [W/(m/K)], D is a temperature difference [K], and E is a heat transfer amount [W].

In the configuration of the heat-dissipating structure 3 of the related art, the thermally conductive sheet 60 is interposed between the heat sink 70 and the heat block 20, and thus a heat transfer amount from the heat sink 70 to the heat block 20 is equal to that of the thermally conductive sheet 60. The heat transfer amount of the thermally conductive sheet 60 will be examined below.

The thermally conductive sheet 60 having a diameter of 14 [mm] has an area of about 154 [mm²]. If the thermally conductive sheet 60 has a thickness of 1.6 [mm], a thermal conductivity of 2.3 [W/(m·K)], and a temperature difference of 20 [K] between both surfaces of the thermally conductive sheet 60, the thermally conductive sheet 60 has a heat transfer amount of 4.42 [W] according to expression 1.

In the heat-dissipating structure 1 of the present embodiment, the recessed portion 12 is provided on the first surface 11 of the heat sink 10 while the side surface S1 of the recessed portion 12 is in contact with the side surface S2 of the heat block 20 with the thermally conductive grease 30 interposed between the side surface S1 and the side surface S2. Thus, a heat transfer amount from the heat sink 10 to the heat block 20 is equal to that of the thermally conductive grease 30. The heat transfer amount of the thermally conductive grease 30 will be examined below.

If the top surface T2 of the heat block 20 has a diameter of 14 [mm] and the heat block 20 in contact with the recessed portion 12 of the heat sink 10 has a height of 3.8 [mm], the thermally conductive grease 30 between the heat sink 10 and the heat block 20 has an area of 167 [mm$^2$]. Moreover, the thermally conductive grease 30 for improving adhesion between the heat sink 10 and the heat block 20 like the thermally conductive sheet has a thickness of 0.1 [mm], which is smaller than that of the thermally conductive sheet. If the thermally conductive grease 30 has a thermal conductivity of 3.0 [W/(m·K)] and a temperature difference is 20 [K] between both surfaces of the thermally conductive grease 30, the thermally conductive grease 30 has a heat transfer amount of 100.23 [W] according to expression 1.

In a comparison between the heat transfer amounts of the thermally conductive grease 30 and the thermally conductive sheet 60 of the related art, it is found that the heat transfer amount of the thermally conductive grease 30 is at least 22 times as large as that of the thermally conductive sheet 60, though the thermally conductive grease 30 and the thermally conductive sheet 60 have the same area and the same surface temperature difference. This is because the thermally conductive sheet 60 has a thermal conductivity of 2.3 [W/(m·K)] while the thermally conductive grease 30 has a larger thermal conductivity of 3.0 [W/(m·K)], and the thermally conductive sheet 60 has a thickness of 1.6 [mm] while the thermally conductive grease 30 has a much smaller thickness of 0.1 [mm].

In the heat-dissipating structure of the related art, the heat sink not provided with the recessed portion is in contact with the heat block so as to dissipate heat, whereas the heat-dissipating structure 1 according to the present embodiment of the present invention is configured such that the side surface S1 of the recessed portion 12 of the heat sink 10 is in contact with the side surface S2 of the heat block 20 so as to dissipate heat. Thus, the heat dissipation of the heat-dissipating structure 1 is affected by tolerances in the radial direction instead of tolerances in the thickness direction.

As described above, the sum of the tolerances in the thickness direction is, for example, 0.4 [mm], whereas a dimensional tolerance in the radial direction of the recessed portion 12 is, for example, 0.1 [mm] and the dimensional tolerance in the radial direction of the heat block 20 is, for example, 0.1 [mm]. The total tolerance in the radial direction is no more than 0.2 [mm].

The accommodation of such small tolerances does not need a thermally conductive sheet having at least a certain thickness. For example, only the provision of the thermally conductive grease 30, which is larger than 0 [mm] and smaller than or equal to 0.3 [mm] in thickness, secures adhesion between the heat sink 10 and the heat block 20.

In the related art, heat is dissipated through the top surface T2 of the heat block 20, whereas in the heat-dissipating structure 1 of the first embodiment, heat is dissipated at least through the side surface S2 of the heat block 20. The heat dissipation efficiency also depends on a contact area between the heat block 20 and the heat sink 10. In order to increase the area of the top surface T2 of the heat block 20, a mounting area on the printed circuit board 40 needs to be extended. In addition to an increase in the area of the top surface T2 of the heat block 20, an increase in the height of the side surface S2 of the heat block 20 and the depth of the recessed portion 12 can extend the area of the side surface of the heat block 20 opposed to the side surface S1 of the recessed portion 12 of the heat sink 10. Thus, as compared with the related art, the heat-dissipating structure 1 of the present embodiment can easily increase a contact area between the heat block 20 and the heat sink 10, thereby facilitating improvement of heat dissipation efficiency.

As described above, the heat-dissipating structure 1 according to the present embodiment of the present invention can improve heat dissipation efficiency as compared with the heat-dissipating structure of the related art. In particular, a fanless heat-dissipating structure can also sufficiently obtain heat dissipation efficiency. However, the present invention is not limited to a fanless heat-dissipating structure. The provision of a fan can further increase heat dissipation efficiency.

(Second Embodiment)

Figure 3:
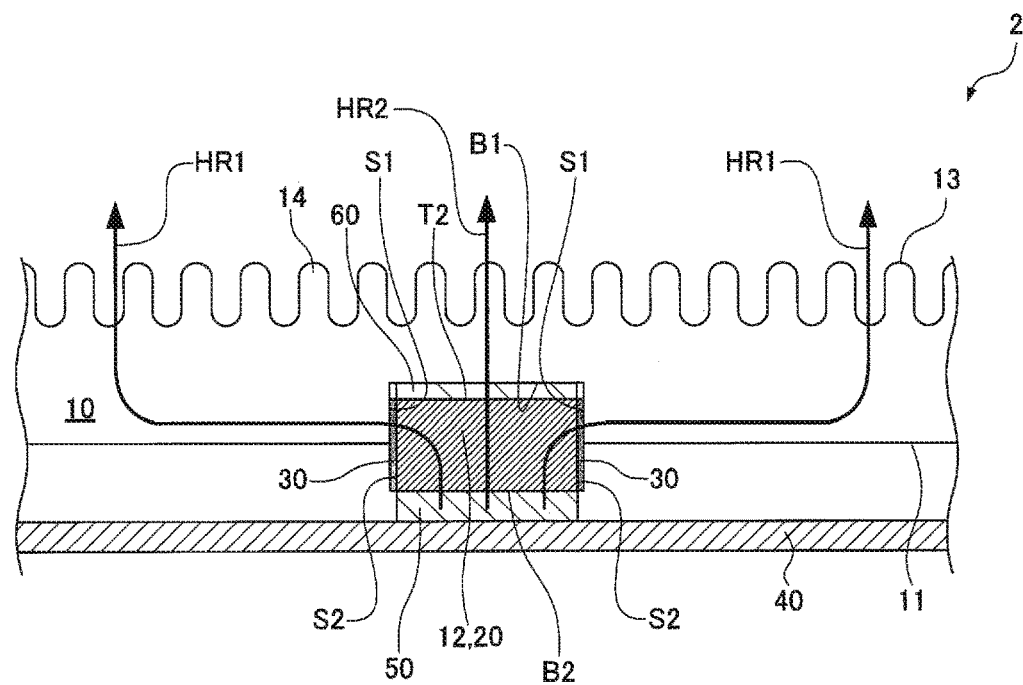
FIG. 3 is a cross-sectional view showing a heat-dissipating structure according to a second embodiment of the present invention.

Referring to FIG. 3, a heat-dissipating structure according to a second embodiment of the present invention will be described below. A heat-dissipating structure 2 according to the second embodiment of the present invention is different from that of the first embodiment in the provision of a thermally conductive sheet 60. Other constituent elements are identical to those of the first embodiment and thus the explanation thereof is omitted. The thermally conductive sheet 60 will be specifically discussed below.

The thermally conductive sheet 60 is in contact with a bottom surface B1 of a recessed portion 12 and a top surface T2 of a heat block 20. In other words, the thermally conductive sheet 60 is interposed between the bottom surface B1 of the recessed portion 12 of a heat sink 10 and the top surface T2 of the heat block 20. The thermally conductive sheet 60 has a thermal conductivity of, for example, 2.3 [W/(m·K)]. The thermally conductive sheet 60 accommodates the dimensional tolerances of components in the thickness direction of the heat sink 10 and erection tolerances between the components. In order to accommodate these tolerances, the thermally conductive sheet 60 has at least a certain thickness and a certain degree of elasticity. The thermally conductive sheet 60 having a thickness of, for example, 2.0 [mm] is compressed into a thickness of, for example, 1.6 [mm] between the bottom surface B1 of the recessed portion 12 and the top surface T2 of the heat block 20. Thus, the heat-dissipating structure 2 of the present embodiment can obtain adhesion between the bottom surface B2 of the recessed portion 12 of the heat sink 10 and the top surface T2 of the heat block 20.

According to the heat-dissipating structure 2 of the present embodiment, as in the heat-dissipating structure of the first embodiment, heat generated by a heat generator 50 is dissipated to the outside along a heat dissipation route HR2 where the heat from the heat generator 50 sequentially passes through the heat block 20, the thermally conductive sheet 60, and the heat sink 10 as in the heat-dissipating structure of the related art, in addition to a heat dissipation route HR1 where the heat from the heat generator 50 sequentially passes through the heat block 20, thermally conductive grease 30, and the heat sink 10.

Thus, in the heat-dissipating structure 2 of the present embodiment, a heat transfer amount from the heat block 20 to the heat sink 10 is equal to the sum of the heat transfer amount of the thermally conductive grease according to the first embodiment and the heat transfer amount of the thermally conductive sheet of the related art. For example, as described in the first embodiment, if the thermally conductive grease 30 has a heat transfer amount of 100.23 [W] and the thermally conductive sheet 60 has a heat transfer amount of 4.42 [W], a heat transfer amount from the heat block 20 to the heat sink 10 is 104.65 [W] according to the second embodiment. Thus, the heat-dissipating structure 2 of the second embodiment can obtain higher heat dissipation efficiency than the heat-dissipating structure of the first embodiment.

In the second embodiment, the thermally conductive sheet 60 interposed between the bottom surface B1 of the recessed portion 12 and the top surface T2 of the heat block 20 presses the heat block 20 and the heat generator in the thickness direction. This can improve adhesion between the heat generator 50 and the heat block 20 as compared with the first embodiment where the thermally conductive sheet is not used.

In the first embodiment, the thermally conductive sheet 60 is not provided between the bottom surface B1 of the recessed portion 12 of the heat sink 10 and the top surface T2 of the heat block 20 and thus the bottom surface B1 and the top surface T2 are not bonded to each other in the thickness direction. Hence, a large heat transfer amount cannot be expected but at least a certain heat transfer amount is transmitted in the thickness direction. As described in the second embodiment, the thermally conductive sheet 60 interposed between the bottom surface B1 and the top surface T2 can bond the bottom surface B1 and the top surface T2 in the thickness direction, thereby increasing a heat transfer amount.

(Third Embodiment)

Figure 4:
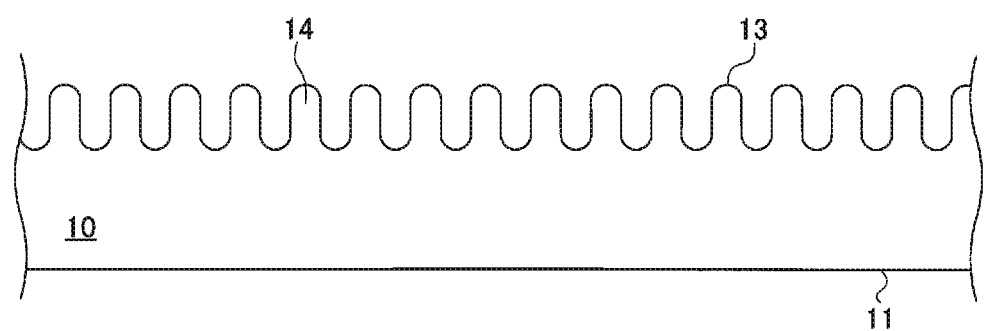
FIG. 4 is a cross-sectional view showing a step of a method for manufacturing the heat-dissipating structure according to the present invention.

Referring to FIGS. 4 to 7, a third embodiment of the present invention will describe an example of a method for manufacturing the heat-dissipating structure according to the first and second embodiments of the present invention. First, as shown in FIG. 4, a heat sink 10 is prepared with a fin 14 formed on a second surface 13. In this configuration, as described above, the fin 14 may not be formed on the second surface 13 of the heat sink 10.

Figure 5:
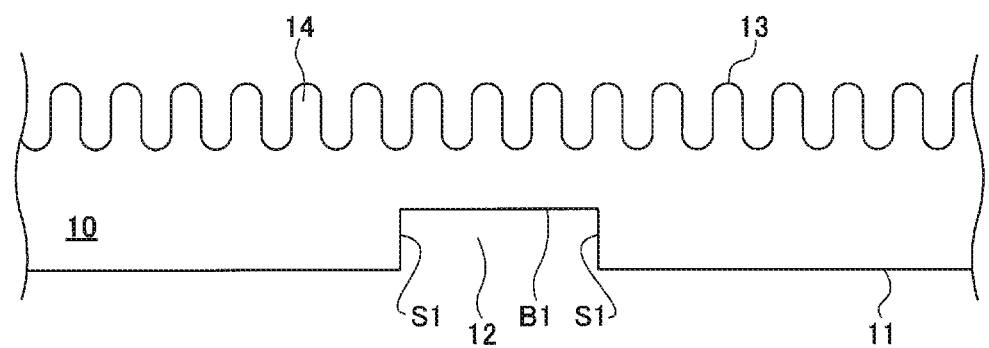
FIG. 5 is a cross-sectional view showing a step of the method for manufacturing the heat-dissipating structure.

Subsequently, as shown in FIG. 5, a recessed portion 12 is formed on the first surface 11 of the heat sink 10. In this case, if the recessed portion 12 is formed along with the molded heat sink 10, it may be difficult to control a dimensional tolerance in a radial direction of the recessed portion 12. Thus, the recessed portion 12 is additionally formed after the heat sink 10 is molded. This can easily control a dimensional tolerance in the radial direction of the recessed portion 12 and change the dimensional tolerance according to the location or size of the recessed portion 12 when necessary. For example, after the heat sink 10 is molded without the recessed portion 12 on the first surface 11, the recessed portion 12 may be formed on the first surface 11 by spot facing. However, the recessed portion of the present invention is not always formed by spot facing. Alternatively, the heat sink initially provided with the recessed portion may be molded. In this case, the recessed portion is formed concurrently with the molding of the heat sink. This can omit the step of additionally forming the recessed portion, thereby reducing the number of manufacturing steps.

Figure 6:
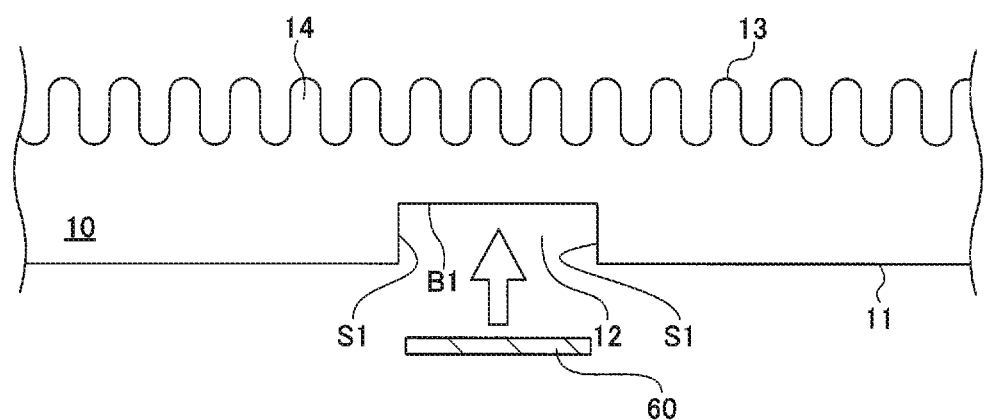
FIG. 6 is a cross-sectional view showing a step of the method for manufacturing the heat-dissipating structure.

As shown in FIG. 6, in the manufacturing of the heat-dissipating structure according to the second embodiment, the thermally conductive sheet 60 is provided on the bottom surface B1 of the recessed portion 12 of the heat sink 10. However, the thermally conductive sheet 60 does not always need to be provided on the bottom surface B1 of the recessed portion 12 and thus may be provided between the bottom surface B1 of the recessed portion 12 and the top surface T2 of the heat block 20. For example, the thermally conductive sheet 60 may be provided on the top surface of the heat block 20. This step is not performed in the manufacturing of the heat-dissipating structure according to the first embodiment.

Figure 7:
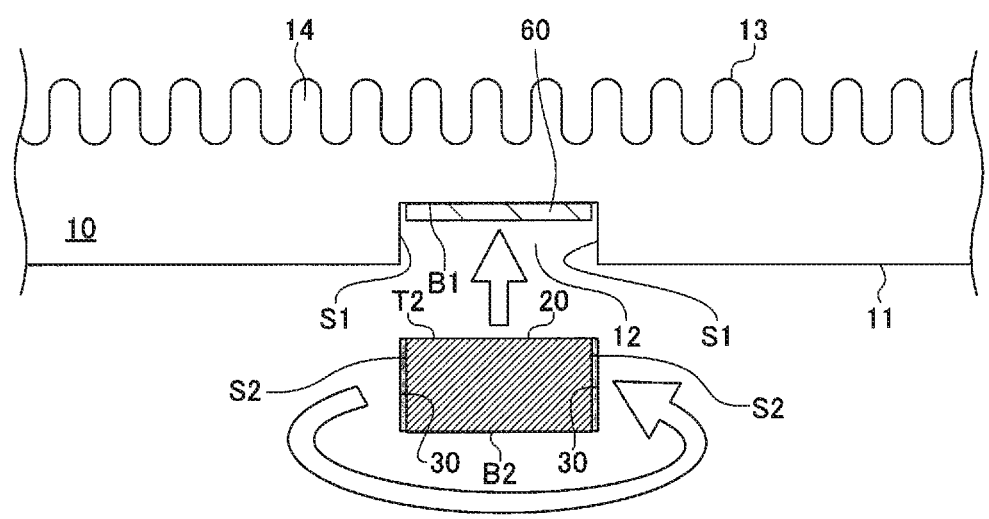
FIG. 7 is a cross-sectional view showing a step of the method for manufacturing the heat-dissipating structure.

Finally, as shown in FIG. 7, the heat block 20 is fit into the recessed portion 12. Before the heat block 20 is fit, the thermally conductive grease 30 is applied to the side surface S2 of the heat block 20. This brings the heat block 20 into contact with the side surface S1 of the recessed portion 12 with the thermally conductive grease 30 interposed between the side surface S1 and the side surface S2. The thermally conductive grease 30 may be applied to the side surface S1 of the recessed portion 12 instead of the side surface S2 of the heat block 20 or may be applied to both side surfaces S1 and S2.

If the thermally conductive sheet 60 is provided to manufacture the heat-dissipating structure of the second embodiment, the heat sink 10 and the thermally conductive sheet 60 are placed in contact with each other and the thermally conductive sheet 60 and the heat block 20 are placed in contact with each other. In other words, the bottom surface B1 of the recessed portion 12 and the top surface T2 of the heat block 20 are placed in contact with each other with the thermally conductive sheet 60 interposed between the bottom surface B1 and the top surface T2.

In this configuration, the heat block 20 is desirably fit into the recessed portion 12 while rotating about the cylindrical axis of the heat block 20, which will be specifically described below. In order to fit the heat block 20 into the recessed portion 12 of the heat sink 10, a dimensional difference is necessary between the diameters of the heat block 20 and the recessed portion 12. Specifically, the heat block 20 is slightly smaller in diameter than the recessed portion 12. Since the heat block 20 is inserted into the recessed portion 12 while being rotated, the heat block 20 is easily inserted even if the dimensional difference between the diameters of the recessed portion 12 and the heat block 20 is minimized. For example, the recessed portion 12 has a diameter of 14.2 [mm] and the heat block 20 has a diameter of 14.0 [mm], resulting in a small dimensional difference of 0.2 [mm]. This can improve adhesion between the side surface S1 of the recessed portion 12 of the heat sink 10 and the side surface S2 of the heat block 20, thereby increasing the heat dissipation efficiency of the heat-dissipating structure.

As shown in FIG. 2 or 3, the heat-dissipating structure configured thus includes the heat generator 50 in contact with the bottom surface B2 of the heat block 20, thereby dissipating heat from the heat generator 50 to the outside.

The recessed portion 12 of the heat sink 10 and the heat block 20 are, but not exclusively, cylindrical in the first and second embodiments. For example, even if the recessed portion of the heat sink and the heat block are shaped like polygonal columns, the side surface of the heat block is in contact with the side surface of the recessed portion with the thermally conductive grease interposed between the side surfaces, achieving higher heat dissipation efficiency as compared with the heat-dissipating structure of the related art. In the case of the cylindrical shape, the heat block can be fit into the recessed portion while being rotated.

Figure 8:
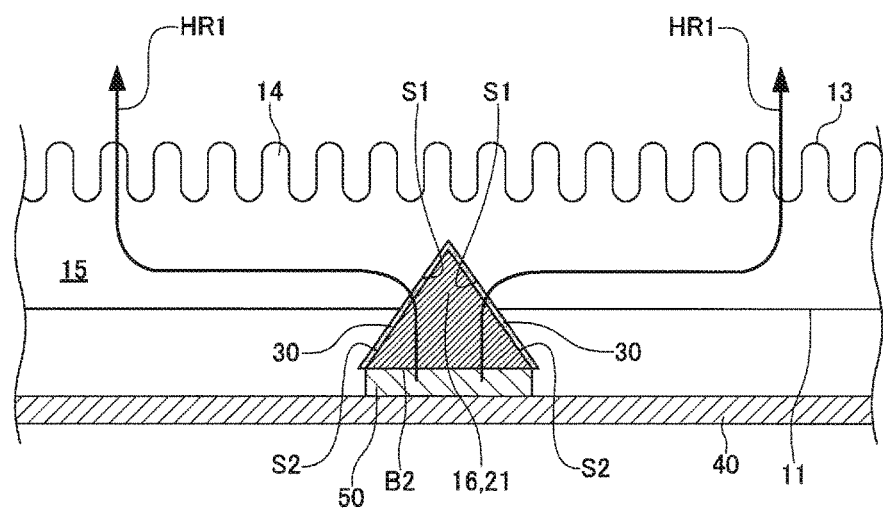
FIG. 8 is a cross-sectional view showing a heat-dissipating structure according to another embodiment of the present invention.

In the first embodiment, the recessed portion 12 of the heat sink 10 has the bottom surface B1 and the heat block 20 has the top surface T2. The present invention is not limited to this configuration. The recessed portion of the heat sink may not have the bottom surface and the heat block may not have the top surface. For example, as shown in FIG. 8, the recessed portion 16 of the heat sink 15 and the heat block 21 may be conical or pyramidal. Also in this case, the side surface S2 of the heat block 21 is in contact with the side surface S1 of the recessed portion 16 of the heat sink 15 with the thermally conductive grease 30 interposed between the side surface S1 and the side S2, thereby improving heat dissipation efficiency as compared with the heat-dissipating structure of the related art. In the case of a pyramidal or conical shape, the side surface can have a larger area than that of a cylinder or a polygonal column, thereby improving the heat dissipating structure. In the case of a conical shape, the heat block can be fit into the recessed portion while being rotated.

Having described the invention, the following is claimed:

1. A heat-dissipating structure comprising:
   a heat sink having a recessed portion on a first surface facing a heat generator, the recessed portion having a bottom surface and a side surface;
   a heat block fit into the recessed portion, the heat block having a top surface, a bottom surface, and a side surface;
   thermally conductive grease in contact with both of the side surface of the recessed portion and the side surface of the heat block; and
   a thermally conductive sheet in contact with both of the bottom surface of the recessed portion and the top surface of the heat block,
   wherein the bottom surface of the heat block is in contact with the heat generator.

2. The heat-dissipating structure according to claim 1, wherein the recessed portion and the heat block are each shaped like a cylinder having a central axis perpendicular to the first surface of the heat sink.

3. A method for manufacturing a heat-dissipating structure comprising a heat sink having a recessed portion on a first surface facing a heat generator, and a heat block fit into the recessed portion, the method comprising:
   applying thermally conductive grease to at least one of a side surface of the recessed portion and a side surface of the heat block; and
   fitting the heat block into the recessed portion while rotating the heat block about a central axis of the heat block with a thermally conductive sheet provided between a bottom surface of the recessed portion and a top surface of the heat block such that the heat sink and the thermally conductive sheet are in contact with each other and the thermally conductive sheet and the heat block are in contact with each other.

4. The method for manufacturing the heat-dissipating structure according to claim 3, further comprising forming the recessed portion on the first surface of the heat sink by spot facing.

* * * * *